(12) United States Patent
Gill

(10) Patent No.: US 8,270,125 B2
(45) Date of Patent: Sep. 18, 2012

(54) TUNNEL JUNCTION MAGNETORESISTIVE SENSOR HAVING A NEAR ZERO MAGNETOSTRICTION FREE LAYER

(75) Inventor: Hardayal Singh Gill, Palo Alto, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 697 days.

(21) Appl. No.: 11/959,374

(22) Filed: Dec. 18, 2007

(65) Prior Publication Data
US 2009/0155629 A1 Jun. 18, 2009

(51) Int. Cl.
*G11B 5/39* (2006.01)
*H01F 10/08* (2006.01)

(52) U.S. Cl. ........ 360/324.11; 428/811.1; 428/811.2; 428/812; 360/324.12; 360/324.2; 257/421; 324/207.21; 365/158; 365/171; 365/173

(58) Field of Classification Search .............. None
See application file for complete search history.

(56) References Cited

U.S. PATENT DOCUMENTS

| | | | | |
|---|---|---|---|---|
| 7,036,208 | B2 | 5/2006 | Ho et al. | 29/603.13 |
| 7,351,483 | B2* | 4/2008 | Parkin | 428/811.1 |
| 7,466,526 | B2* | 12/2008 | Sato et al. | 360/324.2 |
| 7,695,761 | B1* | 4/2010 | Shen et al. | 427/127 |
| 2005/0238924 | A1* | 10/2005 | Gill | 428/837 |
| 2007/0025029 | A1 | 2/2007 | Hayakawa et al. | 360/324.2 |
| 2007/0070553 | A1 | 3/2007 | Tsunekawa et al. | 360/313 |
| 2007/0076471 | A1 | 4/2007 | Kano et al. | 365/158 |
| 2007/0111332 | A1 | 5/2007 | Zhao et al. | 438/3 |
| 2007/0139827 | A1 | 6/2007 | Gao et al. | 360/324.2 |
| 2007/0164265 | A1 | 7/2007 | Kajiyama | 257/3 |
| 2007/0177421 | A1 | 8/2007 | Sugiyama et al. | 365/158 |
| 2007/0243639 | A1* | 10/2007 | Pietambaram et al. | 438/3 |
| 2008/0316657 | A1* | 12/2008 | Zhang et al. | 360/324.11 |
| 2009/0096045 | A1* | 4/2009 | Hayakawa et al. | 257/421 |
| 2010/0178528 | A1* | 7/2010 | Tsunekawa et al. | 428/811.1 |

* cited by examiner

*Primary Examiner* — Kevin Bernatz
(74) *Attorney, Agent, or Firm* — Zilka-Kotab, PC

(57) ABSTRACT

A magnetoresistive tunnel junction sensor having improved free layer stability, as well as improved free sensitivity. The free layer is constructed to have a low magnetic coercivity which improves free layer sensitivity. The free layer is also constructed to have a negative magnetostriction which improves free layer stability by preventing the free layer from having an easy axis that is oriented perpendicular to the air bearing surface.

10 Claims, 4 Drawing Sheets

TUNNEL JUNCTION MAGNETORESISTIVE SENSOR HAVING A NEAR ZERO MAGNETOSTRICTION FREE LAYER

FIELD OF THE INVENTION

The present invention relates to magnetoresistive sensors and more particularly to a sensor having high TMR values and having a free layer with low magnetostriction for increased free layer stability, and low coercivity for improved free layer sensitivity.

BACKGROUND OF THE INVENTION

The heart of a computer is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air hearing surface (ABS). The suspension arm biases the slider into contact, with the surface of the disk when the disk is not rotating but, when the disk rotates, air is swirled by the rotating disk. When the slider rides on the air bearing, the write and read heads are employed for writing magnetic impressions to and reading magnetic impressions from the rotating disk. The read and write heads are connected to processing circuitry that, operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed, for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is pinned perpendicular to the air bearing surface (ABS) and the magnetic moment of the free layer is located parallel to the ABS, but free to rotate in response to external magnetic fields. The magnetization of the pinned layer is typically pinned by exchange coupling with an antiferromagnetic layer.

The thickness of the spacer layer is chosen to be less than, the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter tire resistance of the spin valve sensor in proportion to $\cos \Theta$, where $\Theta$ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

In the push to increase data density and sensor performance, researchers have sought to develop tunnel junction sensors (TMR sensor). These sensors operate based on the spin dependent tunneling of electrons through a thin, electrically insulating barrier layer. Several conflicting design requirements have limited the effectiveness of such sensors. For example, TMR sensors are very sensitive to the grain structure of certain layers within the sensor. However, the need to provide a desired grain structure in, for example, a free layer can result in a free layer having a positive magnetostriction, which can lead to an unstable sensor.

Therefore, there is a strong felt need for a TMR sensor design that can overcome the conflicting design requirements in order to produce a sensor that has a sensitive, low coercivity free layer preferably with a negative or zero magnetostriction. Such as sensor would also preferably have a high TMR ratio.

SUMMARY OF THE INVENTION

The present invention provides a magnetoresistive tunnel junction sensor having improved free layer sensitivity, improved free layer stability and high TMR values. The sensor includes a free layer structure, pinned layer structure and a barrier layer sandwiched between the free layer structure and the pinned layer structure. The free layer includes a layer of CoFe adjacent to the barrier layer and a layer of CoFeB adjacent to the layer of CoFe. A series of layers are then formed adjacent to the layer of CoFeB, the series of layers including at least one layer of NiFe and at least one layer of CoFeX, wherein X is a material selected from the group consisting of Nb, Mo, Hf, Zr, Y, W, Si, Cr and Ti.

The series of layers formed over the CoFeB layer keeps the grain structure of the capping layer (formed over the free layer) from affecting the grain structure of the magnetic layer or layers closest to the barrier layer during high temperature annealing. This advantageously allows the portions of the free layer closest to the barrier layer to maintain a desired Body Centered Cubic (BCC) crystalline structure.

The series of layers formed over the CoFeB layer also reduces the coercivity of the free layer. This advantageously improves free layer sensitivity.

The design of the free layer also results in the free layer having a zero or negative magnetorestriction. This advantageously improves free layer stability.

In another embodiment of the invention, the free layer can include a layer of CoFeB adjacent to the barrier layer and an amorphous layer adjacent to the layer of CoFeB away from the barrier layer. The amorphous layer can be a layer of CoFeX, where X is one or more materials selected from the group consisting of Nb, Mo, Hf, Zr, Y, W, St, Cr and Ti.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the folio wing detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
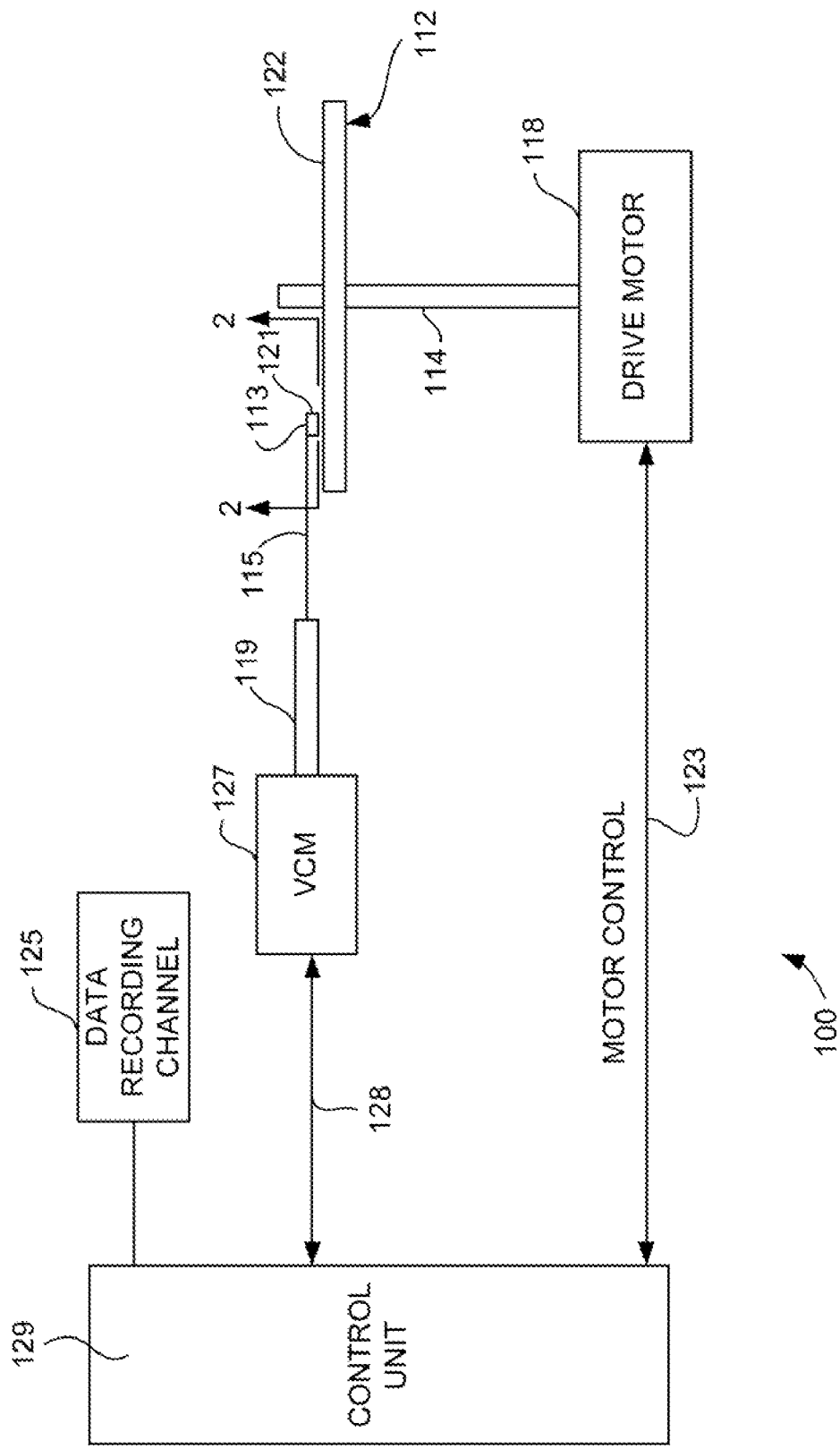
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control Signals on line 128. The control signals on line 128 provide the desired current profiles to optimally move and position slider 113 to the desired data track on disk 112. Write and read signals are communicated to and from write and read heads 121 by way of recording channel 125.

Figure 2:
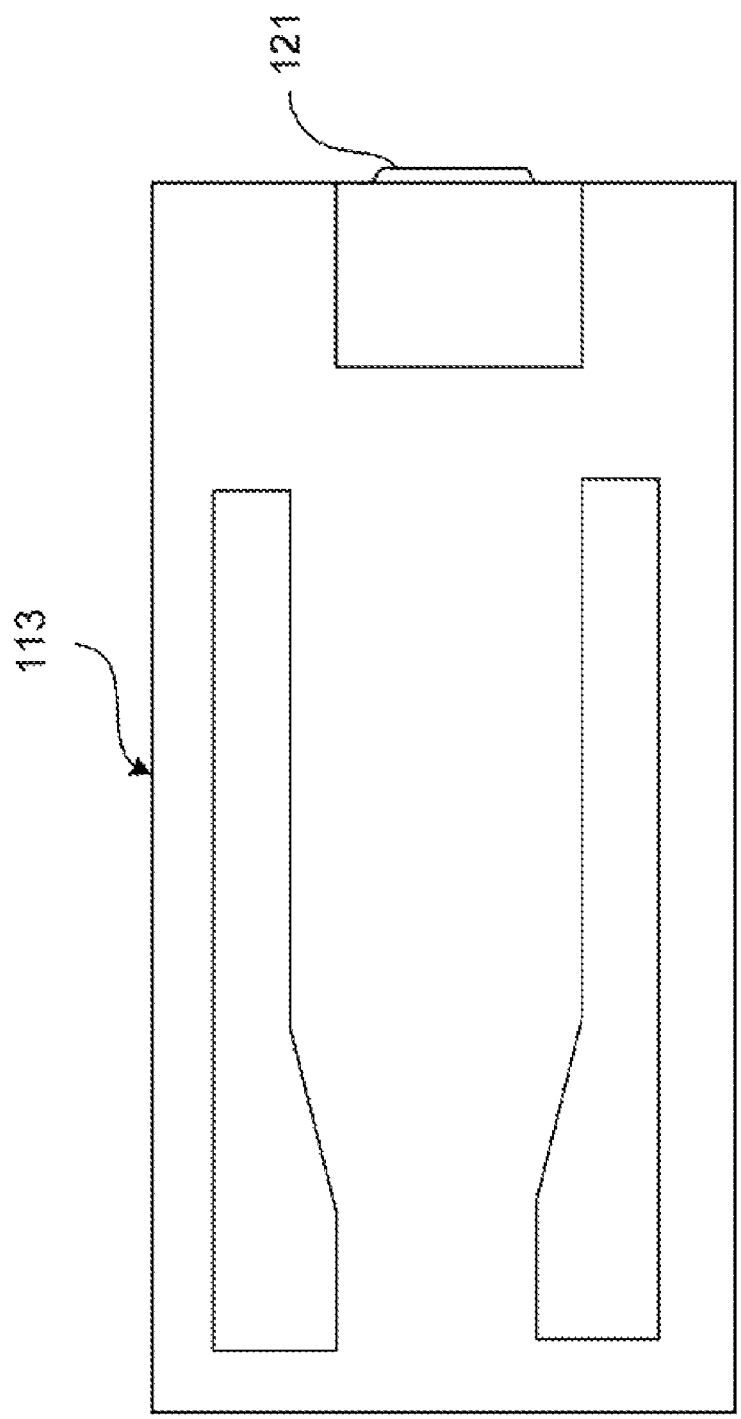
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
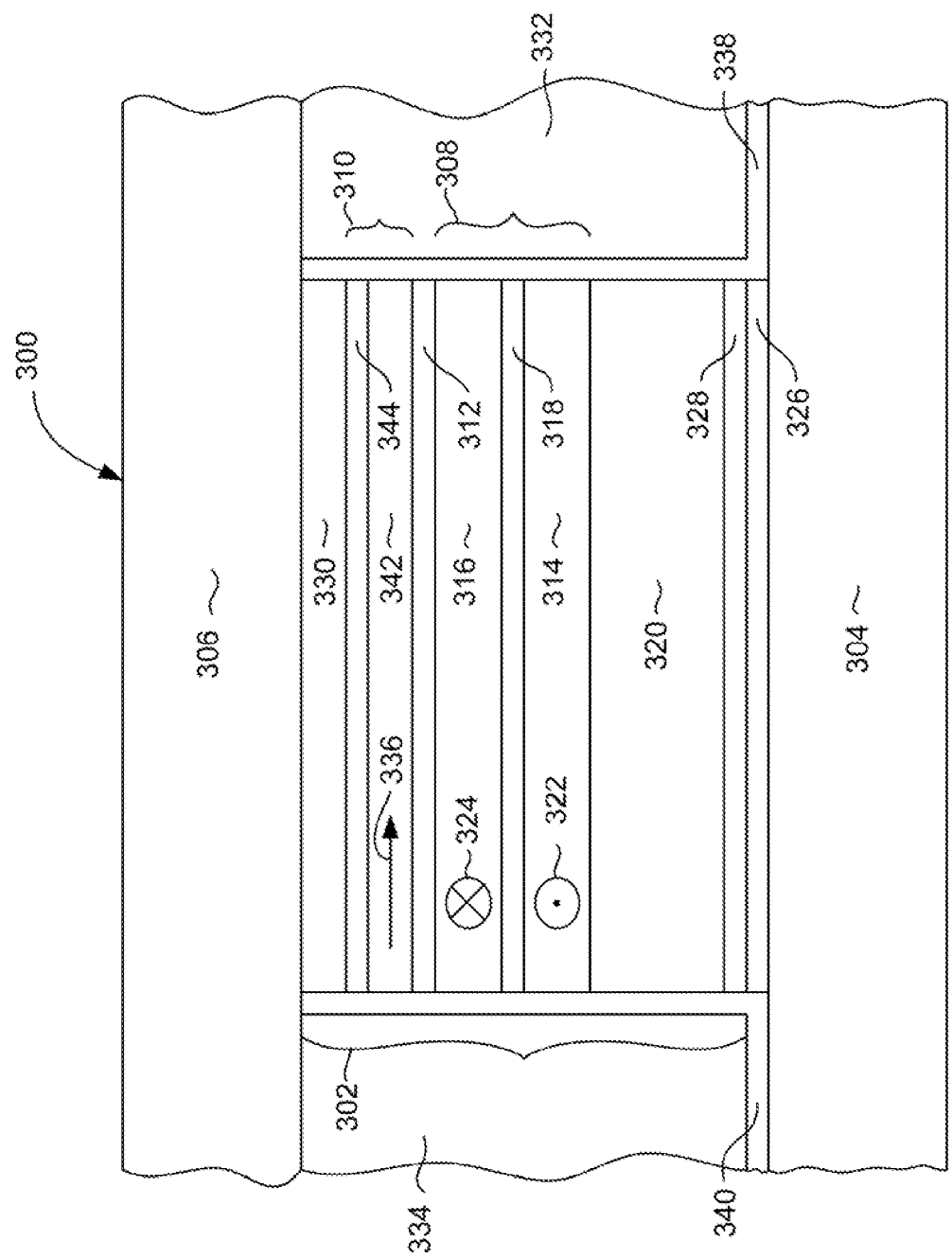
FIG. 3 is an enlarged ABS view of a magnetoresistive sensor of a magnetic head for use in disk drive system.

With reference now to FIG. 3, a Tunnel Junction Magnetoresistive (TMR) sensor 300 has a sensor stack 302 sandwiched between first and second leads 304, 306. The leads 304, 306 can be formed of an electrically conductive, magnetic material such as NiFe so that they can function as magnetic shields as well as electrically conductive leads.

The sensor stack includes a pinned layer structure 308, a free layer structure 310 and a thin, electrically insulating barrier layer 312 sandwiched between the pinned layer structure 312 and the free layer structure 310. The barrier layer 312 can be constructed of a material such as MgO.

The pinned layer structure 308 includes first and second magnetic layers 314, 316 that are antiparallel coupled across a non-magnetic AP coupling layer 318 sandwiched therebetween. A layer of antiferromagnetic material (AFM layer) 320 is exchange coupled with the first magnetic layer 314 of the pinned layer structure 308. This exchange coupling strongly pins the magnetization of the first magnetic layer 314 in a first direction perpendicular to the ABS as indicated by arrow head symbol 322. Antiparallel coupling between the first and second, magnetic layers 314, 316 pins the magnetization of the second magnetic layer in a second, direction (opposite to the first direction) as indicated by arrow tail symbol 324.

The AFM layer can be constructed of a material such as IrMn or IrMnCr. The first magnetic layer 314 can be constructed of CoFe and can have about 30 atomic percent Fe. The second magnetic layer 316 (adjacent to the barrier layer 312) can be constructed of CoFeB. Seed layers 326, 328 can be provided at the bottom of the sensor stack to initiate a desired grain structure in the above sensor layers. The first seed layer 326 can be constructed of Ta and the second seed layer 328 can be constructed of Ru. A capping layer such as Ru or Ta 330 can be provided at the top of the sensor stack to protect the sensor layers during manufacturing processes such as high temperature annealing.

First and second hard magnetic bias layers 332, 334 can be provided at either side of the sensor stack. The bias layers 332, 334 can be constructed of a hard magnetic material such as CoPt or CoPtCr and provide a magnetic bias field (not shown) that biases the magnetization of the free layer in a direction parallel with the ABS as indicated by arrow symbol 336. First and second insulation layers 338, 340 separate the bias layers 332, 334 from the sensor stack 302 and from the first lead 304 to prevent current from being shunted through the bias layers 332, 334.

Free Layer Structure

With reference still to FIG. 3, the tree layer 310 includes a layer of CoFeB 342 adjacent to the barrier layer 312. The free layer 310 also includes a layer of CoFeX 344 located away from the barrier 312 (ie. towards the cap layer 330).

In order for the sensor to achieve optimal magnetic properties, it is desirable that the magnetic layer 342 adjacent to the barrier 312 have a Body Center Cubic (BCC) grain structure. Such a structure ensures optimal spin dependent tunneling through the barrier layer 312.

It is worth mentioning here that, in order to set the magnetizations 322, 324 of the pinned layer 308, a high temperature anneal must be performed. This high temperature anneal can cause the BCC structure of the barrier layer 312 to affect the grain structure of the magnetic layer 342, causing the layer 342 to have a desirable BCC grain structure. However, The capping layer 330 has a FCC grain structure, and during the high temperature anneal, this FCC structure of the capping layer 330 could cause the free layer 310 to have an undesirable FCC structure.

The magnetic layer 344, however, prevents this from happening. The CoFeX layer 330 is amorphous and is resistant to crystallization during the high temperature anneal. Therefore, the amorphous CoFeX layer 344 acts as a buffer layer, preventing the grain structure from the capping layer 330 from affecting the CoFeB layer 342 of the free layer 310. In order to provide robust resistance to crystallization during the high temperature anneal, the amount of element X in the CoFeX is preferably 30 atomic percent or greater, and can be as high as 60-70 atomic percent. The element X can be: Nb, Mo, Hf Zr, Y, W, Si, Cr, Ti, or can be a combination of these elements. The inclusion of element X at concentrations as high or higher than 30 atomic percent raises the recrystalization temperature of the layer 344 to a high temperature, above that necessary for the annealing process. Preventing the underlying layer 342 from taking on an undesirable FCC grain structure allows the free layer 310 to maintain soft magnetic properties (i.e. low coercivity) for improved sensor performance.

Figure 4:
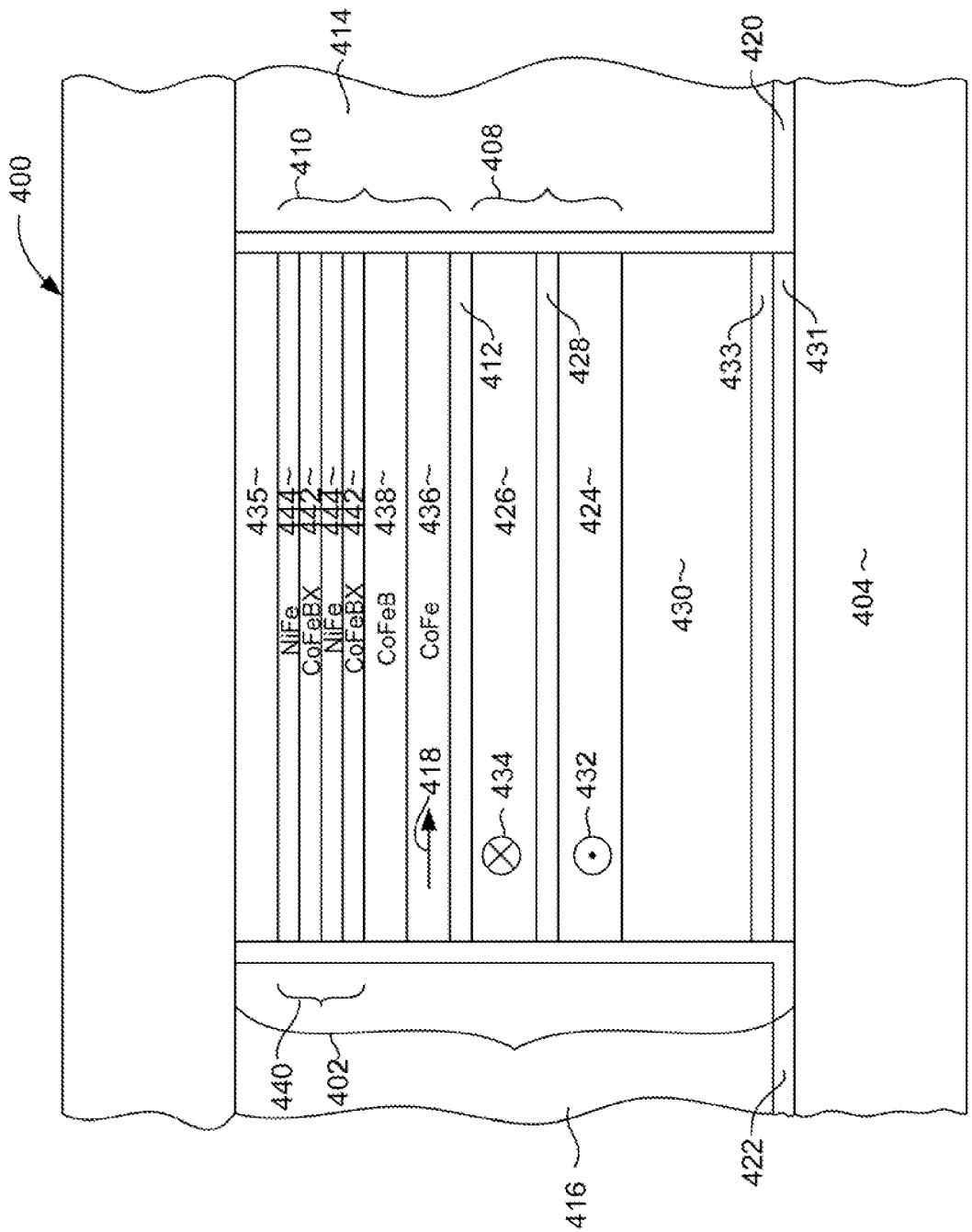
FIG. 4 is an enlarged ABS view of a magnetoresistive sensor according to another embodiment of the invention.

With reference now to FIG. 4, another embodiment of the invention 400 is described. A sensor stack 402 sandwiched between first and second leads 404, 406 includes a pinned layer structure 408, a free layer structure 410 and a thin, electrically insulating harrier layer 412 sandwiched between the free layer structure 410 and pinned layer structure 408. First and second hard bias layers 414, 416 can be provided at either side of the sensor stack 402 to bias a magnetization 418 of the free layer 410. The bias layers 414, 416 are each separated from the sensor stack by insulation layers 420, 422.

The pinned layer structure 408 can include first and second magnetic layers 424, 426, which are antiparallel coupled across an AP coupling layer 428. The first, magnetic layer 424 can be exchange coupled with a layer of antiferromagnetic material AFM layer 430 to pin the magnetization 432 of the first magnetic layer 424. As before, antiparallel coupling between the first and second magnetic layers 424, 426 pins the magnetization 424 of the second magnetic layer in a second direction opposite to that of the first direction 432.

The AFM layer 430 can be a material such as IrMn or IrMnCr. The first magnetic layer 424 can be CoFe with about 30 atomic percent Fe. The AP coupling layer 428 can be a thin layer of a material such as Ru. The second magnetic layer 426 can be constructed of CoFeB, and preferably has about 20 atomic percent B and about 25 atomic percent Fe so that the second magnetic layer 426 is amorphous. A high quality MgO barrier layer 412 grows better on top of an amorphous material, so making the layer 426 amorphous as stated above improves the properties of the barrier layer 412.

First and second seed layers 431, 433 can be provided at the bottom of the sensor stack 402 to initiate a desired grain structure in the layers of the sensor stack 302. The first seed layer 431 can be Ta, and the second seed layer can be Ru. Other materials could be used as well. A cap layer 435 is provided at the top of the sensor stack 402 to protect the sensor layers during manufacture.

Free Layer Structure

With continued reference to FIG. 4, the tree layer 410 has a structure that achieves the goals of: low magnetostriction; low coercivity; and high TMR. The free layer structure 410 has a magnetostriction that is near zero or negative. The zero or negative magnetostriction of the free layer structure 410 promotes free layer stability by avoiding the creation of an undesirable easy axis oriented perpendicular to the ABS, which would otherwise result if the free 410 had a positive magnetostriction and this positive magnetostriction were combined with compressive stresses in which are inevitably present in sensor as a result of lapping operations.

The low coercivity of the free layer structure 410 promotes free layer sensitivity by keeping the free layer 410 magnetically soft so that its magnetization can easily respond to the presence of an external magnetic field. The tree layer structure 410 produces high TMR values by maintaining a desirable Body Centered Cubic (BCC) crystalline structure near the barrier layer 412.

The free layer structure 410 includes a first magnetic layer 436 constructed of CoFe, A second magnetic layer 438 formed directly on the first magnetic layer 436 is constructed of CoFeB. The second magnetic layer 438 preferably has a B content of 15 to 25 atomic percent and preferably has an Fe content greater than 25 atomic percent. This ensures that the layer 438 will be amorphous as deposited. However, the possibility exists that some microcrystallization may occur during high temperature annealing. In order to assure that any microcrystallization that does occur is in a BCC phase (and not FCC), the layer 438 preferably has an Fe content greater than 25 atomic percent. However, as Fe content increases, so does the magnetostriction of the layer. Therefore, the layer 438 preferably has an Fe content of 30-40 atomic percent.

The combined thickness of the first and second magnetic layers 436, 438 preferably equal about 30-35 Angstroms. A series of magnetic layers 440 are formed on top of the first and second layers 436, 438. The series of layers 440 includes alternating thin layers of CoFeX 442 and NiFe 444. The element "X" in the CoFeX layers 442 can be a materials selected from the group consisting of: Nb, Mo, Hf, Zr, Y, W, Si and Ti. The series of layers 440 can include two CoFeX and two layers of NiFe in an alternating arrangement as shown (i.e. CoFeX/NiFe/CoFeX/NiFe) or can include some other number of such layers. However, as mentioned above, the underlying first and second layers 436, 438 should together have a thickness of 30-35 Angstroms. Therefore, if a certain desired total free layer thickness is to be maintained (such as, for example, about 40-60 Angstroms or about 50 Angstroms) the total allowable thickness for the series of layers 440 will be constrained (for example to about 15-25 Angstroms).

During the high temperature annealing that is necessary to set the pinned layer magnetizations 432, 434, the Face Centered. Cubic (FCC) structure of the cap layer 435, tends to affect underlying layers, transferring this structure onto underlying layers and causing them to also take on an FCC structure. However, as mentioned above, in order to maintain high TMR values, the first magnetic layer 436 must maintain a BCC crystalline structure. Also, as mentioned above, any microcrystallization that occurs m the second magnetic layer 438, must be BCC as well. The series of layers 440 prevent this from happening, acting as a buffer to prevent the FCC structure of the cap layer 435 from affecting the underlying layers 436, 438.

In addition, the series 440 of CoFeBX layers 442 and NiFe layers 444 achieve a low coercivity and low magnetostriction. However, NiFe tends to have an FCC crystalline structure. This FCC structure is prevented, from affecting the underlying layers 436, 438 in several ways. First, the concentration of Ni in the NiFe layers is kept high, such as greater than 90 atomic percent. In addition, the NiFe layers are kept very thin. Materials tend to crystallize when deposited sufficiently thick. By keeping the NiFe layers 444 very thin, these layers are kept in a amorphous state. Furthermore, the NiFe layers 444 are kept away from the underlying layers 436, 438 by making sure that a layer of CoFeBX 442 is disposed between the layers 436, 438 and any of the NiFe layers 444.

Therefore, as can be seen, the above free layer structure achieves the goals of maintaining a low coercivity and low magnetostriction, while also ensuring that the magnetic layers closest to the barrier layer 412 maintain a necessary BCC crystalline structure for high TMR. While various embodiments have been described above, it should be understood that they have been presented by way of example only and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A magnetoresistive sensor, comprising:
   a magnetic pinned layer structure
   a magnetic free layer structure;
   a non-magnetic barrier layer sandwiched between the free layer structure and the pinned layer structure; and
   a capping layer having a Face Centered Cubic (FCC) structure, the free layer structure being sandwiched between the non-magnetic barrier layer and the capping layer;
   wherein the free layer structure further comprises:
   a layer of CoFeB having a Body Centered Cubic (BCC) structure located directly adjacent to the non-magnetic barrier layer; and
   an amorphous, magnetic buffer layer directly adjacent to the layer of CoFeB, opposite the non-magnetic barrier layer;
   wherein the magnetoresistive sensor is subjected to a high temperature anneal, and wherein the amorphous buffer layer prevents the FCC grain structure of the capping layer from affecting the BCC structure of the CoFeB layer.

2. A magnetoresistive sensor as in claim 1 wherein the amorphous magnetic buffer layer comprises CoFeX, where X comprises one or more materials selected from the group consisting of Nb, Mo, Hf, Zr, Y, W, Si, Cr and Ti.

3. A magnetoresistive sensor as in claim 2 wherein the amorphous, magnetic buffer layer comprises at least 30 atomic percent X.

4. A magnetoresistive sensor as in claim 1 wherein the capping layer comprises one or more of Ta and Ru.

5. A magnetoresistive sensor as in claim 1 wherein the pinned layer structure includes a layer comprising CoFeB.

6. A magnetoresistive sensor as in claim 1 wherein the pinned layer structure further comprises:
   a layer of CoFe;
   a layer of CoFeB adjacent to the barrier layer; and
   a non-magnetic antiparallel coupling layer sandwiched between the layer of CoFe and the layer of CoFeB.

7. A magnetoresistive sensor as in claim 6 wherein the layer of CoFeB in the pinned layer structure includes about 20 atomic percent B.

8. A magnetoresistive sensor as in claim 6 wherein the layer of CoFeB in the pinned layer structure includes about 20 atomic percent B and about 25 atomic percent Fe.

9. A magnetoresistive sensor as in claim 6 wherein the layer of CoFeB in the pinned layer structure is amorphous.

10. A magnetoresistive sensor, comprising:
    a magnetic pinned layer structure
    a magnetic free layer structure;
    a non-magnetic barrier layer sandwiched between the free layer structure and the pinned layer structure; and
    a capping layer having a Face Centered Cubic (FCC) structure, the free layer structure being sandwiched between the non-magnetic barrier layer and the capping layer;
    wherein the free layer structure further comprises:
    a layer of CoFeB having a Body Centered Cubic (BCC) structure located directly adjacent to the non-magnetic barrier layer; and
    an amorphous, magnetic buffer layer directly adjacent to the layer of CoFeB, opposite the non-magnetic barrier layer;
    wherein the magnetoresistive sensor is subjected to a high temperature anneal and wherein the amorphous buffer layer has a recrystallization temperature that is above that of the high temperature anneal, such that the FCC structure of the capping layer does not affect the BCC structure of the CoFeB layer.

* * * * *